(12) United States Patent
Lee et al.

(10) Patent No.: US 7,327,292 B2
(45) Date of Patent: Feb. 5, 2008

(54) BUBBLE ERROR REJECTER IN DATA CONVERTER

(75) Inventors: Ho-Young Lee, Seongnam-si (KR); Yong-Sang You, Seoul (KR); Hong-June Park, Pohang-si (KR); Jun-Hyun Bae, Gyeongsangbuk-do (KR); Young-Chan Jang, Daegu (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/451,921

(22) Filed: Jun. 13, 2006

(65) Prior Publication Data

US 2007/0008201 A1    Jan. 11, 2007

(30) Foreign Application Priority Data

Jul. 8, 2005    (KR) .................... 10-2005-0061863

(51) Int. Cl.
*H03M 13/00* (2006.01)
(52) U.S. Cl. ........................... 341/94; 341/155
(58) Field of Classification Search ................ 341/155, 341/120, 118, 94
See application file for complete search history.

(56) References Cited

U.S. PATENT DOCUMENTS

| | | | |
|---|---|---|---|
| 5,072,221 A | 12/1991 | Schmidt | 341/159 |
| 5,576,480 A * | 11/1996 | Hopkins et al. | 73/38 |
| 5,959,564 A | 9/1999 | Gross, Jr. | 341/160 |
| 6,388,602 B1 * | 5/2002 | Yang | 341/159 |
| 6,396,424 B1 * | 5/2002 | Reyhani et al. | 341/97 |
| 6,598,663 B1 * | 7/2003 | Lannutti | 164/520 |
| 6,633,250 B2 * | 10/2003 | Lee et al. | 341/160 |
| 2006/0187105 A1 * | 8/2006 | Sakata et al. | 341/155 |

OTHER PUBLICATIONS

Korean Patent Application No. 1020020058541 to Huh et al., having Publication date of Apr. 1, 2004 (w/ English Abstract page).

* cited by examiner

*Primary Examiner*—Peguy JeanPierre
(74) *Attorney, Agent, or Firm*—Monica H. Choi

(57) ABSTRACT

A bubble error rejecter includes a cascade of front and rear voting sections for correcting bubble errors spanning multiple bits from interpolation. The front voting section generates first correction codes from first thermometer codes determined from preamplified signals. The rear voting section generates second correction codes from the first correction codes and second thermometer codes determined from interpolation of the preamplified signals.

24 Claims, 9 Drawing Sheets

| | | | | |
|---|---|---|---|---|
| 0 | 0 | 0 | 0 | 0 |
| 0 | 0 | 0 | 0 | 0 |
| 0 | 0 | 1 | 0 | 0 |
| 0 | 0 | 0 | 1 | 0 |
| 1 | 0 | 0 | 1 | 0 |
| ... | ... | ... | ... | ... |
| 0 | 1 | 1 | 0 | 1 |
| 1 | 1 | 1 | 0 | 1 |
| 1 | 0 | 1 | 1 | 1 |
| 1 | 1 | 1 | 1 | 1 |
| 1 | 1 | 1 | 1 | 1 |
| EXAMPLE 1 | EXAMPLE 2 | EXAMPLE 3 | EXAMPLE 4 | EXAMPLE 5 (IDEAL CASE) |

|       | BEFORE | AFTER |
|-------|--------|-------|
|       | 0 → | 0 |
|       | 0 → | 0 |
| C5 --→ | 0 → | 0 |
| C4 --→ | 0 → | 0 |
| C3 --→ | 1 → | 0 |
| . . . . . . . . . . . . . |
| C2 --→ | 0 → | 1 |
| C1 --→ | 1 → | 1 |
|       | 1 → | 1 |
|       | 1 → | 1 |

BUBBLE ERROR REJECTER IN DATA CONVERTER

BACKGROUND OF THE INVENTION

This application claims priority to Korean Patent Application No. 2005-61863, filed on Jul. 8, 2005 in the Korean Intellectual Property Office, the disclosure of which is incorporated herein in its entirety by reference.

1. Field of the Invention

The present invention relates generally to error correction in data converters such as analog-to-digital converters, and more particularly, to correcting for bubble errors in an analog-to-digital converter having interpolation.

2. Description of the Related Art

An analog-to-digital converter (ADC) that converts an analog signal into a digital code is widely used in various electronic devices such as display devices, computers, home appliances, and communication systems. The ADC is becoming more important for image signal processing applications as multimedia services become popular.

The ADC is typically included in a system as a subordinate block that intermediates between an analog block and a digital block for signal transfer, thereby directly affecting the performance of the system. Thus, various types of ADCs have been developed for enhancing the performance of the system.

A flash ADC is most frequently used for fast performance, and a pipelined ADC having small size is used for slow performance. An interpolating flash ADC is used for improving input signal resolution, and a folding-interpolating ADC uses interpolation and folding techniques to pre-process an input signal.

Figure 1:
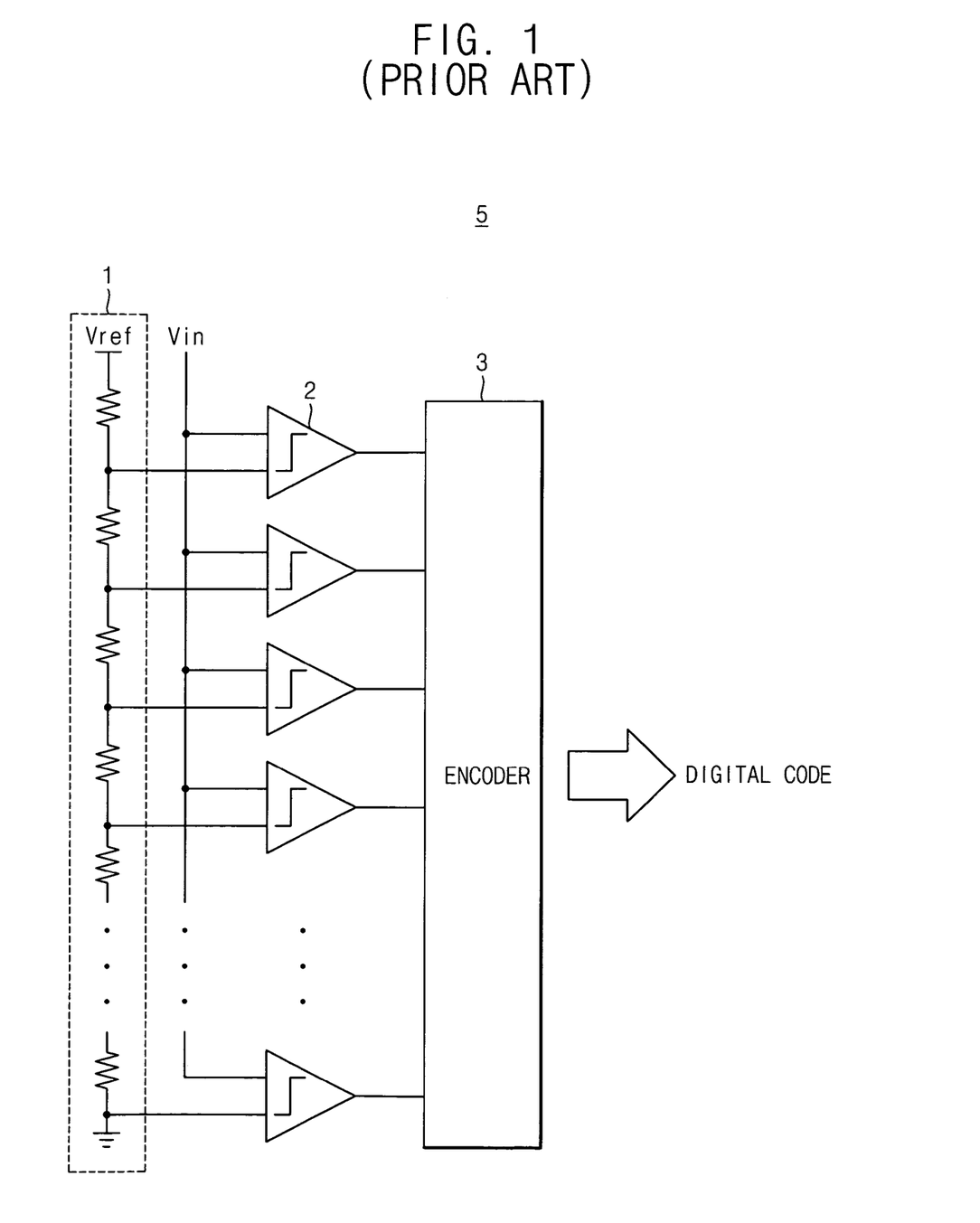
FIG. 1 shows a circuit diagram of a conventional flash analog-to-digital converter (ADC)
Figure 2:
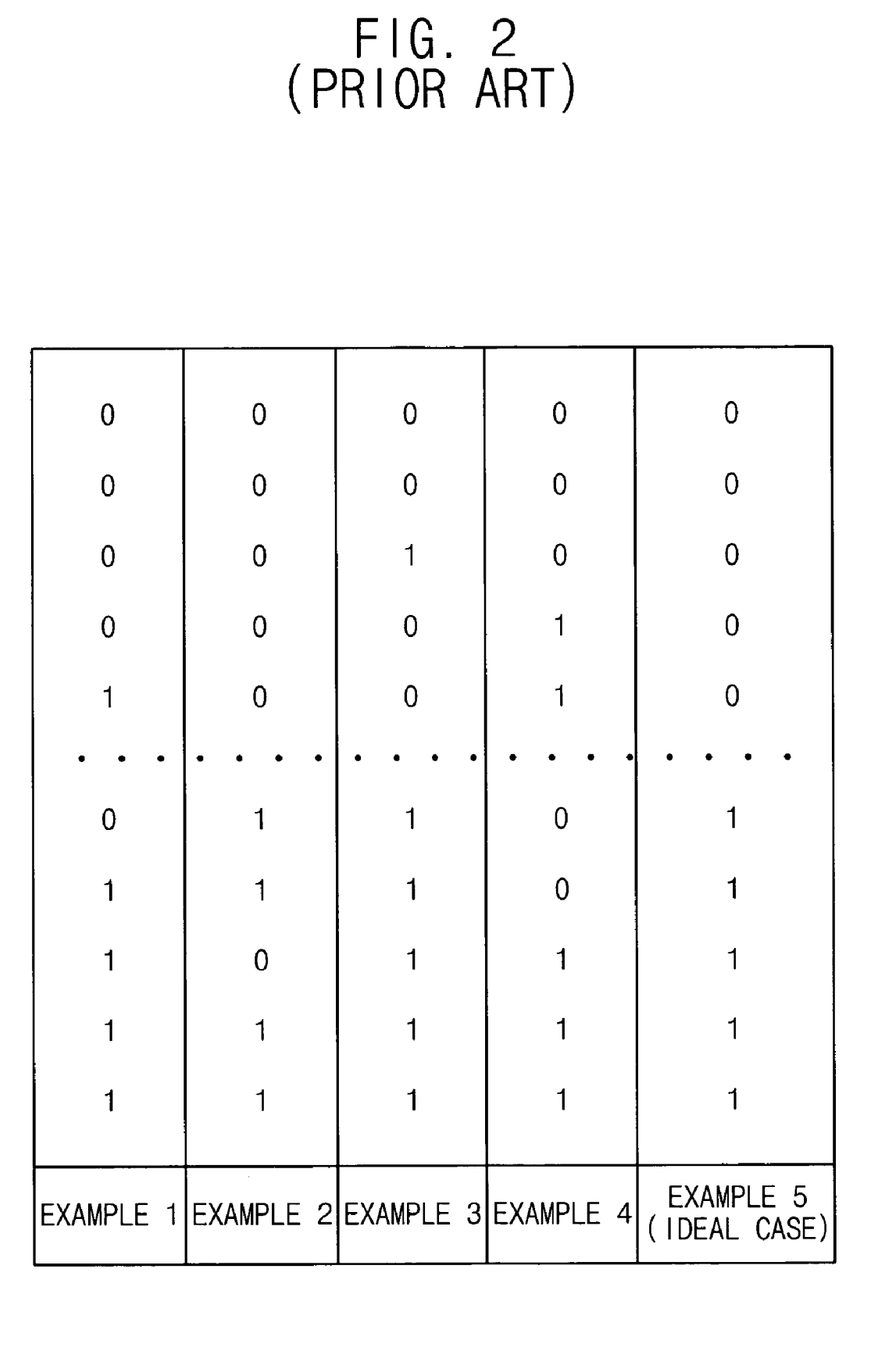
FIG. 2 shows a table of example bubble errors in the ADC of FIG. 1.

FIG. 1 shows a circuit diagram of a conventional flash ADC, and FIG. 2 is a table listing examples of bubble errors within the ADC of FIG. 1. Referring to FIG. 1, a flash ADC 5 includes a reference voltage generator 1 for generating a plurality of reference voltages having different voltage levels. The flash ADC 5 also includes a plurality of comparators 2 for comparing an input signal Vin and the reference voltages to generate decision codes. An encoder 3 of the flash ADC 5 encodes the decision codes into a digital code representing the input signal Vin. A plurality of preamplifiers (not shown) may be disposed before the comparators.

The decision codes from the comparators 2 are referred to as thermometer codes that ideally have a distinctive boundary between sequential '1's and '0's. The encoder 3 detects such a boundary to generate the corresponding digital code for representing the input signal Vin.

The boundary between the sequential '1's and '0's in the thermometer codes conveys important information. Thus, the thermometer codes should ideally have only one clear boundary like EXAMPLE 5 in FIG. 2. Unfortunately, the thermometer codes more typically have an irregular distribution of '1's and '0's near such a desired boundary as illustrated by EXAMPLEs 1, 2, 3, and 4 in FIG. 2.

The irregular distribution of '1's and '0's is referred to as bubble errors because the irregular distribution seems like bubbles at the top level of a liquid in a thermometer. Such bubble errors are caused by many factors, such as the meta-stability of the comparator 2 operating in synchronization with a high-speed clock during a transition of the decision codes, a kickback noise from a clock signal, by a large signal component, or a bandwidth limitation.

The dotted line in FIG. 2 represents an estimated boundary (referred to as a 'Best Guess') between '1's and '0's with the bubble errors. The estimated boundary is desired to be the ideal boundary of EXAMPLE 5. The comparators 2 may include a bubble error rejecter for removing the bubble errors when generating the thermometer codes.

Figure 3:
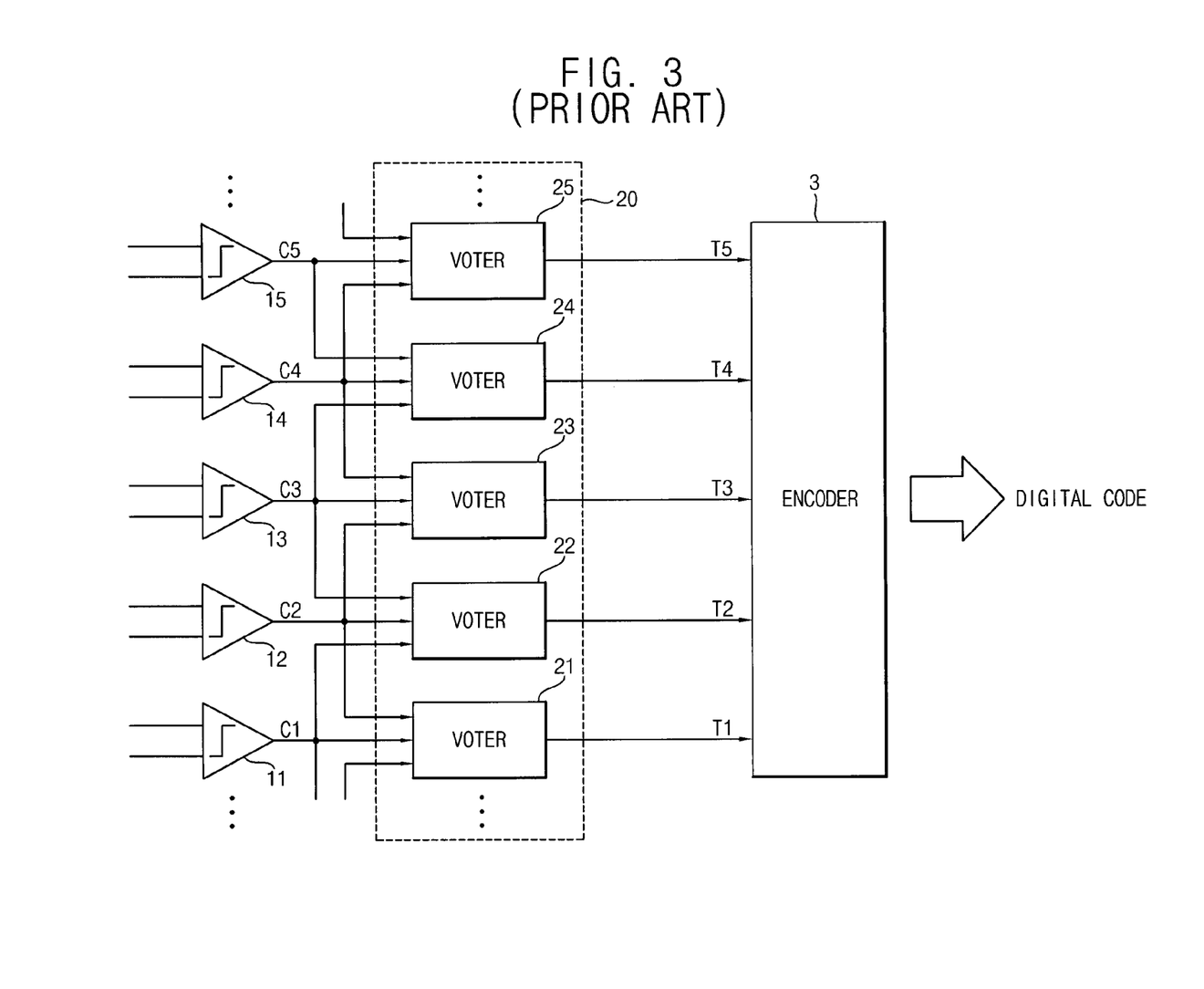
FIG. 3 shows a circuit diagram of an example bubble error rejecter for the flash ADC of FIG. 1.

FIG. 3 shows a conventional flash ADC with a bubble error rejecter 20 for correcting thermometer codes generated by a plurality of sequential comparators 11, 12, 13, 14, and 15. Each of a plurality of voters 21, 22, 23, 24, and 25 within the bubble error rejecter 20 is coupled to a respective one of the comparators 11, 12, 13, 14, and 15 for correcting a respective one of the thermal codes C1, C2, C3, C4, and C5.

Figure 4:
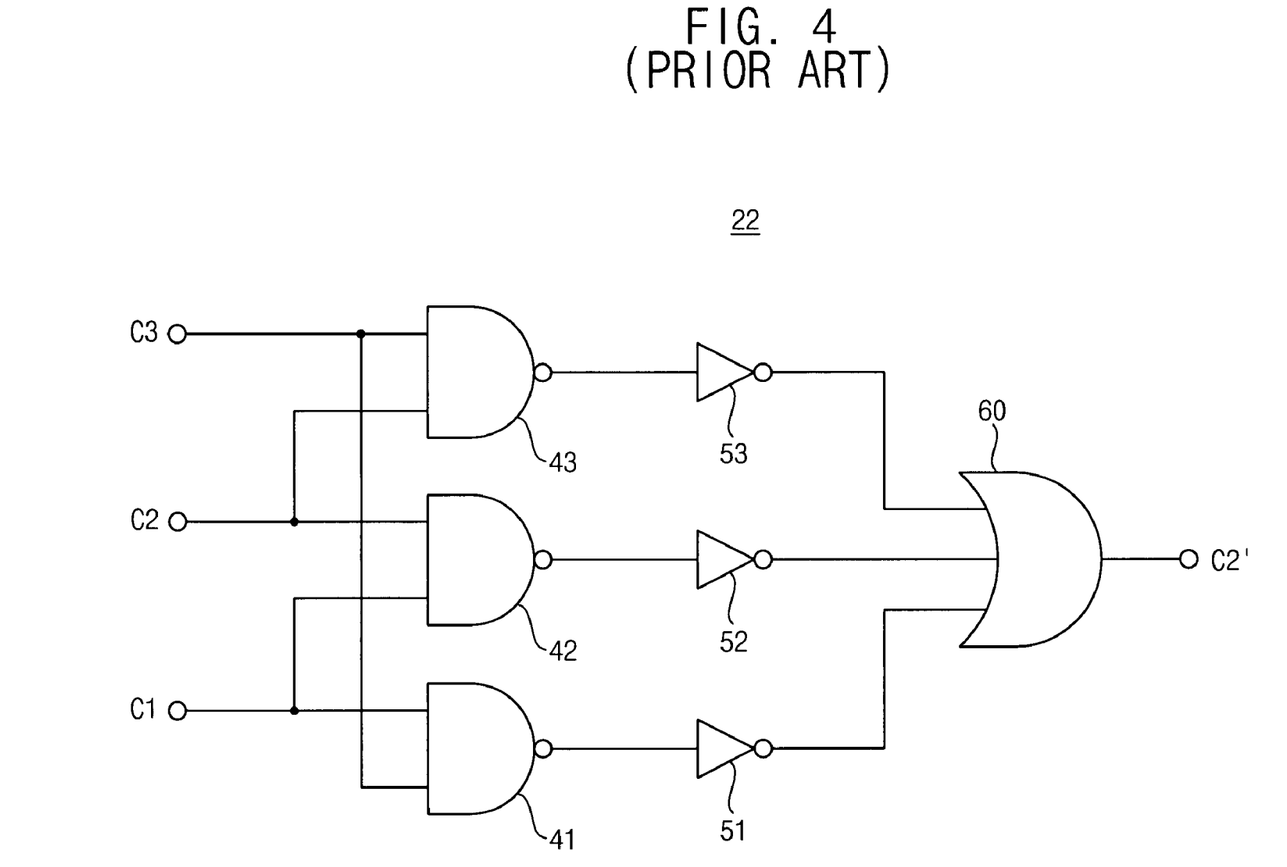
FIG. 4 is a circuit diagram of an example voter in FIG. 3.

Each voter 21, 22, 23, 24, or 25 receives the respective one of the thermal codes C1, C2, C3, C4, or C5 and two adjacent thermal codes from two adjacent comparators (as illustrated in FIG. 3). FIG. 4 shows a circuit diagram of an example voter 22 in FIG. 3 receiving the three thermal codes C1, C2, and C3. The example voter 22 includes NAND gates 41, 42, and 43 with inverters 51, 52, and 53, and an OR gate 60, configured as illustrated in FIG. 4.

With such a configuration of FIG. 4, the example voter 22 outputs a majority bit value among the bit values of the three thermometer codes C1, C2 and C3, to generate a correction code C2' (i.e., T2 in FIG. 3). For example, when the bit values for the three thermometer codes C1, C2 and C3 are respectively '1', '0' and '1', the second voter 22 outputs the majority bit value '1'. Alternatively, when the bit values of the three thermometer codes C1, C2 and C3 are respectively '0', '0' and '1', the second voter 22 outputs the majority bit value '0'. Each of the other voters 21, 23, 24, and 25 in FIG. 3 operates similarly to generate the correction codes T1, T3, T4, and T5, respectively.

Figure 5:
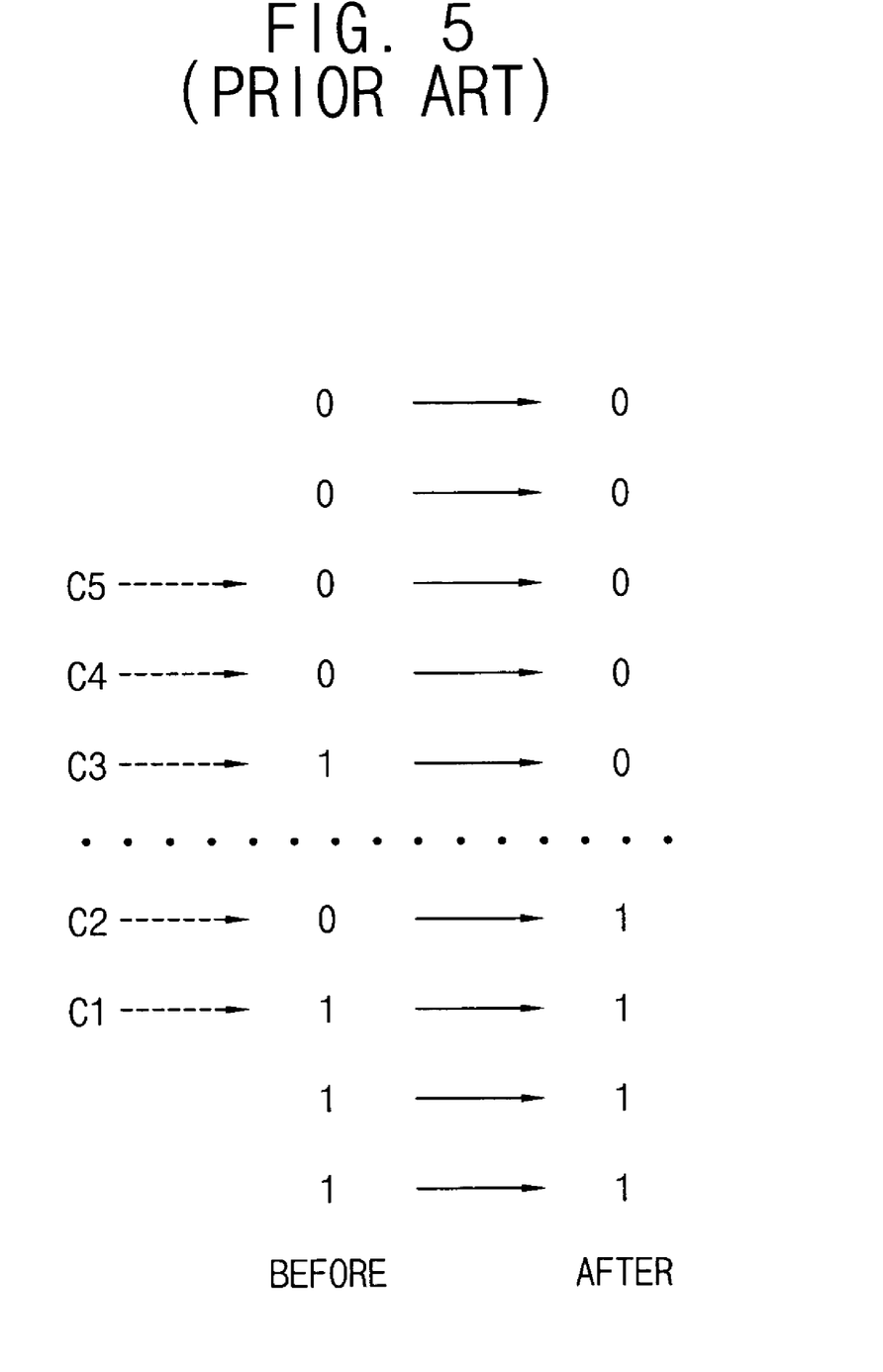
FIG. 5 is a state diagram illustrating a process for removing bubble errors by the bubble error rejecter in FIG. 3.

FIG. 5 shows a state diagram illustrating a process of removing the bubble errors by the bubble error rejecter 20 in FIG. 3. Referring to FIGS. 3, 4 and 5, a bubble error occurs when the second comparator 12 outputs '0' and the third comparator 13 outputs '1'. In this example, the second voter 22 receives thermometer codes '1', '0' and '1' and generates the majority bit value '1'. The third voter 23 receives thermometer codes '0', '1' and '0' and generates the majority bit value '0'. In this manner, the bubble errors are corrected by the second and third voters 22 and 23.

However, because the conventional bubble error rejecter determines the majority bit value from three sequential thermometer codes, bubble errors spanning two or more bits may not be properly corrected. Particularly, in an interpolating flash ADC or a folding-interpolating ADC, bubble errors spanning many bits occur frequently. In that case, the conventional bubble error rejecter may not completely remove the bubble errors.

SUMMARY OF THE INVENTION

Accordingly, bubble error rejecters of embodiments of the present invention include a cascade of voting sections for correcting such bubble errors spanning multiple bits from interpolation.

A bubble error rejecter according to one embodiment of the present invention includes a cascade of front and rear voting sections. The front voting section generates first correction codes from first thermometer codes determined from preamplified signals. The rear voting section generates second correction codes from the first correction codes and second thermometer codes determined from interpolation of the preamplified signals.

In an example embodiment of the present invention, the front voting section includes a plurality of voters. Each such voter generates a respective first correction code by determining a majority bit value from a respective set of m consecutive first thermometer codes.

In another embodiment of the present invention, the rear voting section includes a plurality of voters. Each such voter generates a respective second correction code by determining a majority bit value from a respective second thermometer code and two of the first correction codes adjacent to the respective second thermometer code.

In a further embodiment of the present invention, the bubble error rejecter further includes another rear voting section for generating third correction codes from the first correction codes, the second correction codes, and third thermometer codes determined from further interpolation of the preamplified signals.

In an example embodiment of the present invention, the other rear voting section includes a plurality of voters. Each such voter generates a respective third correction code by determining a majority bit value from a respective third thermometer code, and from one of the first correction codes and one of the second correction codes adjacent to the respective third thermometer code.

In another embodiment of the present invention, the bubble error rejecter further includes a plurality of rear voting sections coupled in cascade. Each such rear voting section generates respective correction codes from the first correction codes, from respective correction codes generated by any prior rear voting section in the cascade, and from respective thermometer codes determined from respective interpolation of the preamplified signals.

In an example embodiment of the present invention, a total number of rear voting sections is equal to k, with $2^k-1$ being a number of interpolations between two adjacent preamplified signals.

The present invention may be used to particular advantage when the first and second correction codes are coupled to an encoder that generates a digital code corresponding to an input voltage within an analog-to-digital converter. However, the bubble error rejecter of the present invention may be used in any other type of data converter or in any electronic device desiring bubble error correction.

In this manner, a cascade of voting sections corrects for bubble errors spanning multiple bits from interpolation of the preamplified signals.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, 7, 8, and 9 refer to elements having similar structure and/or function.

DETAILED DESCRIPTION OF THE INVENTION

Figure 6:
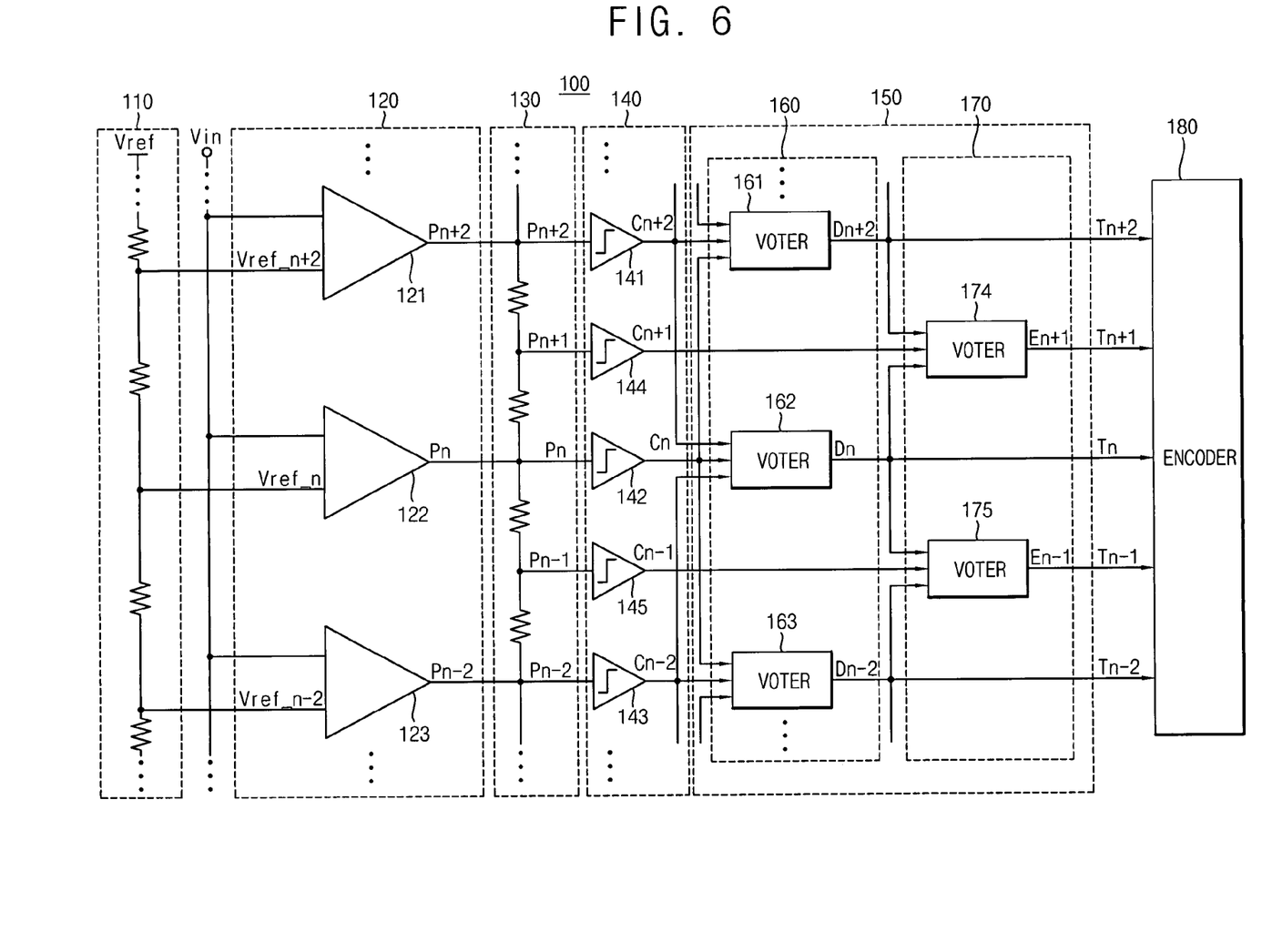
FIG. 6 shows a circuit diagram of an analog-to-digital converter with a bubble error rejecter having a cascade of two voting sections, according to an example embodiment of the present invention.

FIG. 6 shows a circuit diagram of an analog-to-digital converter (ADC) 100 according to an example embodiment of the present invention. Referring to FIG. 6, the ADC 100 includes a reference voltage generator 110, a preamplifying section 120, an interpolating section 130, a comparing section 140, a bubble error rejecter 150, and an encoder 160.

The reference voltage generator 110 is implemented with a resistor array forming a voltage divider for generating a plurality of reference voltages Vref_n+2, Vref_n, and Vref_n−2 having different voltage levels. Each of the reference voltages Vref_n+2, Vref_n, and Vref_n−2 is input by a respective one of a plurality of preamplifiers 121, 122, and 123 of the preamplifying section 120.

The preamplifiers 121, 122, and 123 generate preamplified signals Pn+2, Pn and Pn−2, respectively, from an input signal Vin and the reference voltages Vref_n+2, Vref_n and Vref_n−2, respectively. For example, each of the preamplifiers 121, 122, and 123 amplifies a voltage difference between the input signal Vin and a respective one of the reference voltages Vref_n+2, Vref_n and Vref_n−2.

The interpolating section 130 is implemented with a resistor array forming a voltage divider for interpolating the preamplified signals Pn+2, Pn, and Pn−2 to generate interpolated signals Pn+1 and Pn−1. For example, the interpolated signal Pn+1 is generated from interpolation between the preamplified signals Pn+2 and Pn, and the interpolated signal Pn−1 is generated from interpolation between the preamplified signals Pn and Pn−2.

The comparing section 140 receives the preamplified signals Pn+2, Pn and Pn−2 and the interpolated signals Pn+1 and Pn−1 to generate thermometer codes Cn+2, Cn+1, Cn, Cn−1, and Cn−2. The comparing section 140 includes a plurality of comparators 141, 142, 143, 144, and 145 generating the thermometer code Cn+2, Cn, Cn−2, Cn+1, and Cn−1, respectively, from the preamplified or interpolated signals Pn+2, Pn, Pn−2, Pn+1, and Pn−1, respectively.

The thermometer codes from the comparing section 140 are prone to have bubble errors from noises due to offsets of the preamplifiers 121, 122 and 123 and the comparators 141, 142, 143, 144, and 145. The bubble error rejecter 150 removes such bubble errors after the comparing section 140.

The bubble error rejecter 150 includes a cascade of a front voting section 160 and a rear voting section 170. The bubble error rejecter 150 includes at least one rear voting section 170 with the total number of rear voting section(s) in the bubble error rejecter 150 being equal to k when the number of interpolated signals between two adjacent preamplified signals is equal to $2^k-1$. In FIG. 6, k=1 with one interpolated signal being generated between any two adjacent preamplified signals (Pn+2 and Pn) or (Pn and Pn−2).

The front voting section 160 includes a plurality of front voters 161, 162 and 163 receiving a respective one of the first thermometer codes Cn+2, Cn and Cn−2. In addition, each of the front voters 161, 162 and 163 receives two adjacent first thermometer codes to determine a majority bit value from the three adjacent first thermometer codes to generate first correction codes Dn+2, Dn and Dn−2, respectively.

For example, the front voter 162 receives and determines a majority bit value among the three adjacent first thermometer codes Cn+2, Cn, and Cn−2 to generate the first correction code Dn. Thus, the front voters 161, 162 and 163 of the front voting section 260 remove any bubble error in the first thermometer codes Cn+2, Cn, and Cn−2.

The rear voting section 170 removes any bubble error in the second thermometer codes Cn+1 and Cn−1 by using the first correction codes Dn+2, Dn, and Dn−2 from the front voting section 170. The rear voting section 170 includes a plurality of rear voters 174 and 175 that receive the second thermometer codes Cn+1 and Cn−1, respectively. In addition, each of the rear voters 174 and 175 receives two of the first correction codes Dn+2, Dn, and Dn−2 adjacent to the respective second thermometer code of the rear voter. The rear voters 174 and 175 generate second correction codes En+1 and En−1, respectively, by determining a majority bit value from such inputs.

For example, the rear voter 174 receives the second thermometer code Cn+1 and the first correction codes Dn+2 and Dn adjacent to the second thermometer code Cn+1. The rear voting section 174 determines a majority bit value among such inputs Cn+1, Dn+2, and Dn to generate the second correction code En+1. Similarly, the rear voting section 175 determines a majority bit value among the second thermometer code Cn−1 and the adjacent first correction codes Dn and Dn−1 to generate the second correction code En−1.

The first and second correction codes Dn+2, En+1, Dn, En−1, and Dn−2 are coupled to the encoder as encoder inputs Tn+2, Tn+1, Tn, Tn−1, and Tn−2, respectively. The encoder then determines a digital code corresponding to the input voltage Vin from such encoder inputs Tn+2, Tn+1, Tn, Tn−1, and Tn−2 having the bubble errors removed.

In this manner, by having a cascade of voting sections 160 and 170, the bubble error(s) spanning multiple bits from interpolation in the interpolating section 130 is effectively removed.

Figure 7:
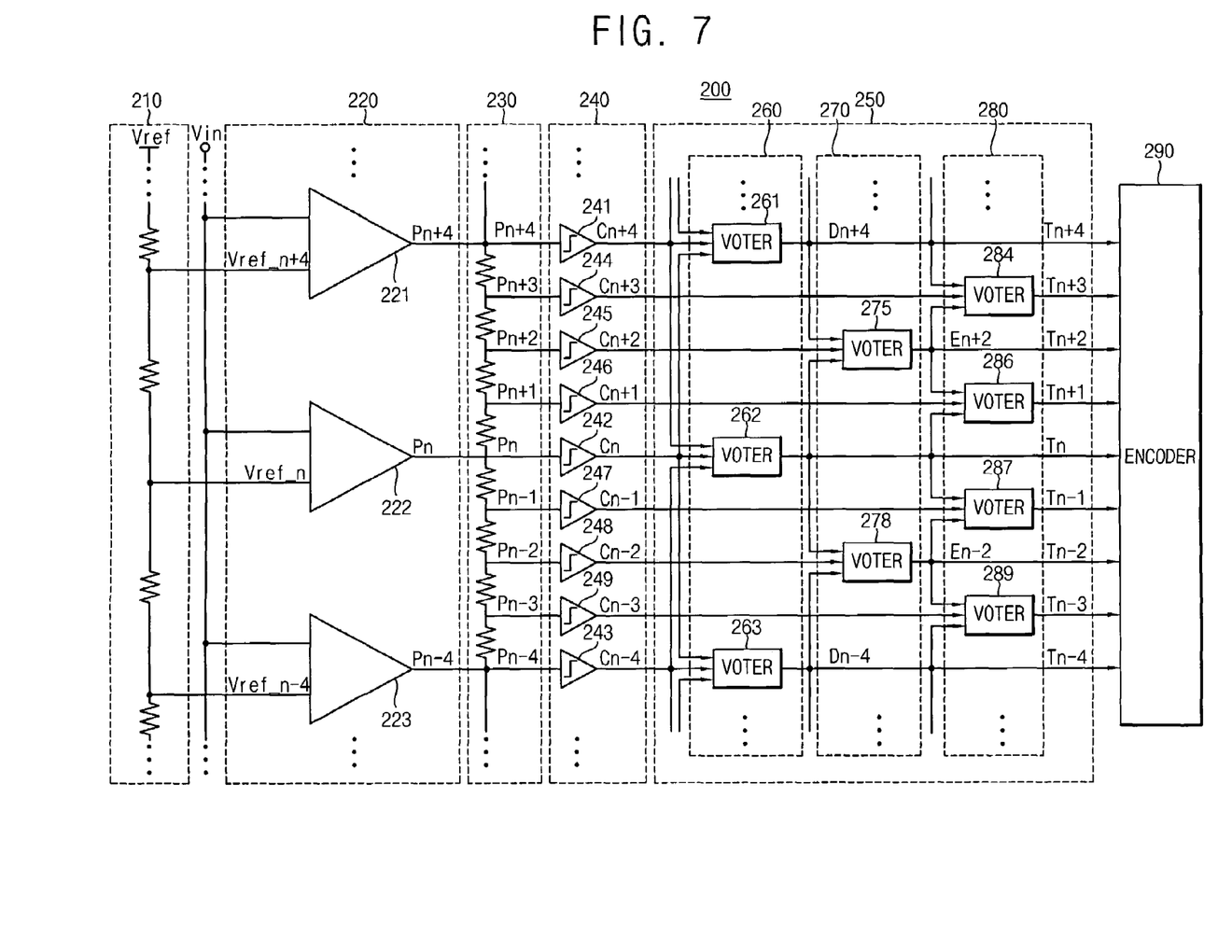
FIG. 7 shows a circuit diagram of an analog-to-digital converter with a bubble error rejecter having a cascade of three voting sections, according to another example embodiment of the present invention.

FIG. 7 shows a circuit diagram of an analog-to-digital converter (ADC) 200 having multiple rear voting sections 270 and 280 according to another example embodiment of the present invention. Referring to FIG. 7, the ADC 200 includes a reference voltage generator 210, a preamplifying section 220, an interpolating section 230, a comparing section 240, a bubble error rejecter 250, and an encoder 290.

The reference voltage generator 210 is implemented with a resistor array forming a voltage divider for generating a plurality of reference voltages Vref_n+4, Vref_n, and Vref_n−4 having different voltage levels. The preamplifiers 221, 222, and 223 of the preamplifying section 220 generate preamplified signals Pn+4, Pn, and Pn−4, respectively, from the input signal Vin and the reference voltages Vref_n+4, Vref_n, and Vref_n−4, respectively. For example, each of the preamplifiers 221, 222, and 223 amplifies a voltage difference between the input signal Vin and a respective one of the reference voltages Vref_n+4, Vref_n, and Vref_n−4.

The interpolating section 230 includes a resistor array forming a voltage divider for interpolating the preamplified signals Pn+4, Pn, and Pn−4 to generate interpolated signals Pn+3, Pn+2, Pn+1, Pn−1, Pn−2, and Pn−3. The interpolated signals Pn+3, Pn+2, and Pn+1 are generated by interpolation between the adjacent preamplified signals Pn+4 and Pn. The interpolated signals Pn−1, Pn−2, and Pn−3 are generated by interpolation between the adjacent preamplified signals Pn and Pn−4. In the example of FIG. 7, the number of interpolations and thus the number of interpolated signals between two adjacent preamplified signals (Pn+4 and Pn) or (Pn and Pn−4) is $2^k-1$, with k being 2.

The comparing section 240 receives the preamplified signals Pn+4, Pn, and Pn−4 to generate first thermometer codes Cn+4, Cn, and Cn−4, respectively there-from. The interpolated signals Pn+2 and Pn−2 are generated from interpolation of the preamplified signals Pn+4, Pn, and Pn−4. The other interpolated signals Pn+3, Pn+1, Pn−1, and Pn−3 are generated from further interpolation of the preamplified signals Pn+4, Pn, and Pn−4 and the interpolated signals Pn+2 and Pn−2.

The comparing section 240 also receives the interpolated signals Pn+2 and Pn−2 to generate second thermometer codes Cn+2 and C−2, respectively there-from. The comparing section 240 further receives the interpolated signals Pn+3, Pn+1, Pn−1, and Pn−3 to generate third thermometer codes Cn+3, Cn+1, Cn−1, and Cn−3 respectively there-from.

The comparing section 240 includes a plurality of comparators 241, 242, 243, 244, 245, 246, 247, 248, and 249 generating the thermometer codes Cn+4, Cn, Cn−4, Cn+3, Cn+2, Cn+1, Cn−1, Cn−2, Cn−3, respectively, from the preamplified and interpolated signals, Pn+4, Pn, Pn−4, Pn+3, Pn+2, Pn+1, Pn−1, Pn−2, Pn−3, respectively.

The first thermometer codes Cn+4, Cn, and Cn−4 are more likely to have bubble errors due to offsets, and such bubble errors may influence the interpolated signals Pn+3, Pn+2, Pn+1, Pn−1, Pn−2, Pn−3, causing multi-bit bubble errors. The bubble error rejecter 250 follows the comparing section 240 to remove such multi-bit bubble errors.

The bubble error rejecter 250 includes a cascade of a front voting section 260 and first and second rear voting sections 270 and 280. The total number of rear voting sections 270 and 280 in the bubble error rejecter 250 is k=2 with the number of interpolated signals between two adjacent preamplified signals being equal to $2^k-1$. In FIG. 7, respective three interpolated signals are generated between any of the two adjacent preamplified signals (Pn+4 and Pn) or (Pn and Pn−4).

The front voting section 260 includes a plurality of front voters 261, 262 and 263, each receiving a respective set of m=3 adjacent first thermometer codes Cn+4, Cn, and Cn−4. Each of the front voters 261, 262, and 263 determines a respective majority bit value from such respective inputs to generate a respective one of first correction codes Dn+4, Dn, and Dn−4.

For example, the front voter 262 receives the three adjacent first thermometer codes Cn+4, Cn, and Cn−4. The front voter 262 then determines a majority bit value among such inputs Cn+4, Cn, and Cn−4 to generate the respective first correction code Dn. In this manner, the front voters 261, 262, and 263 remove the bubble errors from the first thermometer codes Cn+4, Cn, and Cn−4 in generating the first correction codes Dn+4, Dn, and Dn−4.

The first rear voting section 270 includes a plurality of first rear voters 275 and 278, each receiving a respective one of the second thermometer codes Cn+2 and Cn−2. In addition, each of the first rear voters 275 and 278 receives two of the first correction codes Dn+4, Dn, and Dn−4 adjacent to that respective second thermometer code. Each of the first rear voters 275 and 278 determines a majority bit value among such inputs to generate a respective one of second correction codes En+2 and En−2.

For example, the first rear voter 275 receives the second thermal code Cn+2 and the first correction codes Dn+4 and Dn adjacent to such a second thermal code Cn+2. The first rear voter 275 then determines a majority bit value among such inputs Cn+2, Dn+4, and Dn to generate the second correction code En+2. The other first rear voter 278 operates similarly to generate the second correction code En−2 from the inputs Cn−2, Dn−4, and Dn. In this manner, the first rear voters 275 and 278 remove the bubble errors in the second thermometer codes Cn+2 and Cn−2.

The second rear voting section 280 includes a plurality of second rear voters 284, 286, 287, and 289, each receiving a respective one of the third thermometer codes Cn+3, Cn+1, Cn−1 and Cn−3. In addition, each of the second rear voters 284, 286, 287, and 289 receives one of the first correction codes Dn+4, Dn and Dn−4 and one of the second correction codes En+2 and En−2 adjacent to that respective third thermometer code. Each of the second rear voters 284, 286, 287, and 289 determines a majority bit value among such inputs to generate a respective one of third correction codes Tn+3, Tn+1, Tn−1, and Tn−3.

For example, the second rear voter 286 receives the third thermometer code Cn+1. In addition, the second rear voter 268 receives the second correction code En+2 and the first correction code Dn that are adjacent to the third thermometer code Cn+1. The second rear voter 286 then determines the majority bit value among such inputs Cn+1, En+2, and Dn to generate a third correction code Tn+1. The other second rear voters 284, 287, and 289 operate similarly to generate the third correction codes Tn+3, Tn−1, and Tn−3, respectively. In this manner, the second rear voters 284, 286, 287, and 289 correct for bubble errors in the third thermal codes Cn+3, Cn+1, Cn−1 and Cn−3.

Figure 8:
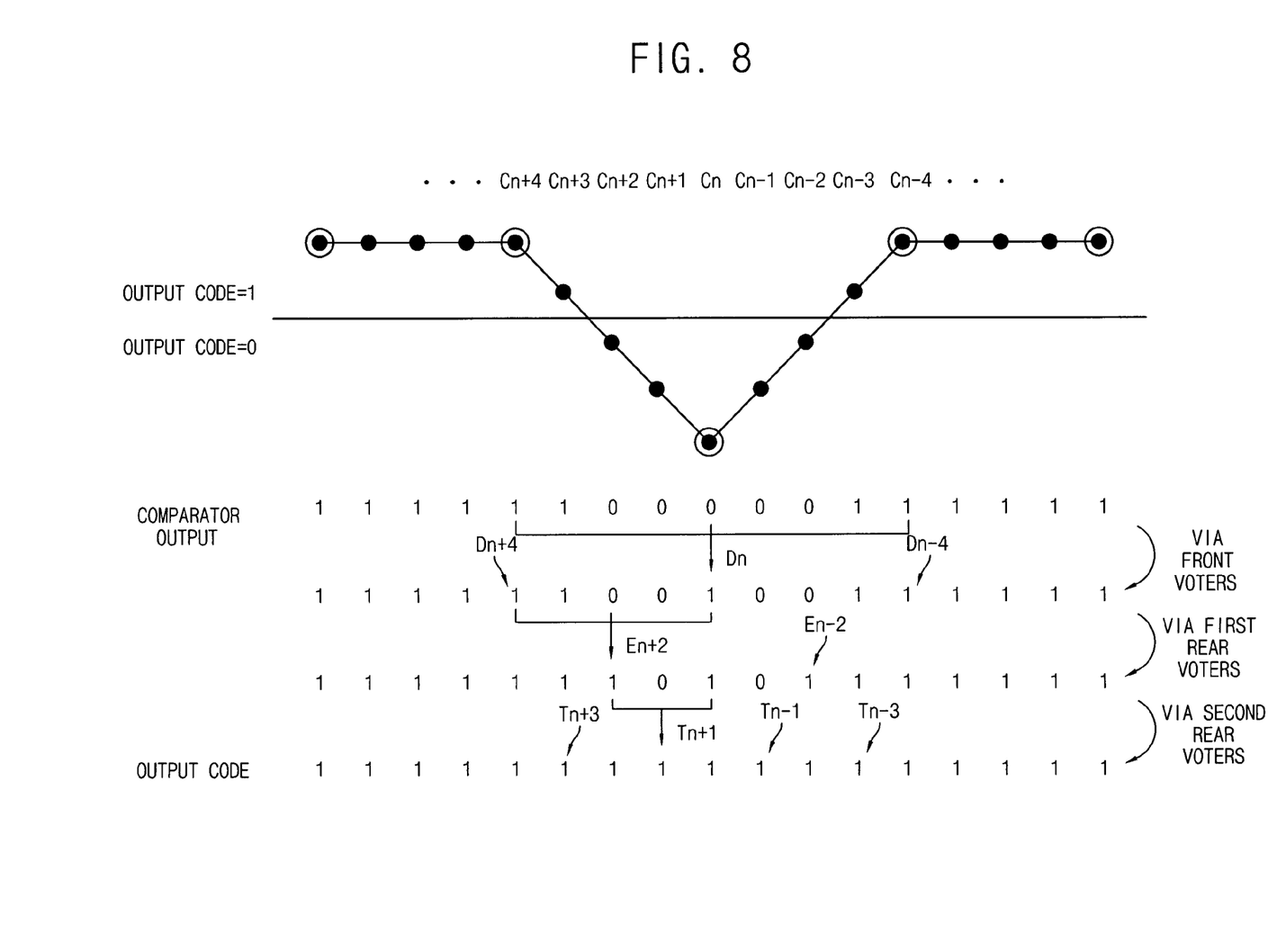
FIG. 8 is a state diagram illustrating an example process for removing bubble errors by the bubble error rejecter in FIG. 7, according to an embodiment of the present invention.

FIG. 8 is a state diagram illustrating an example process of removing the bubble errors by the bubble error rejecter of FIG. 7. Solid dots of the upper part in FIG. 8 represent thermal codes from the comparators 241, 242, 243, 244, 245, 246, 247, 248, and 249. Specifically, the encircled dots are for the first thermometer codes Cn+4, Cn, and Cn−4 generated from the preamplified signals. The non-encircled dots are generated from interpolated signals and include the second and third thermometer codes Cn+3, Cn+2, Cn+1, Cn−1, C−2, and Cn−3.

Referring to FIGS. 7 and 8, all of the thermometer codes Cn+4, Cn+3, Cn+2, Cn+1, Cn, Cn−1, Cn−2, Cn−3, and Cn−4 are supposed to have a logic high code '1'. However, a bubble error is caused by a large offset voltage in a preamplifier for one first thermometer code Cn such that bubble errors also occur in the adjacent second and third thermometer codes Cn+2, Cn+1, Cn−1, and Cn−2.

First, the front voting section 260 corrects the bubble errors in the first thermometer codes Cn+4, Cn, and Cn+4 to generate the first correction codes Dn+4, Dn, and Dn−4 as illustrated in FIG. 8. Subsequently, the first rear voting section 270 corrects the bubble errors in the second thermometer codes Cn+2 and Cn−2 to generate the second correction codes En+2 and En−2 as illustrated in FIG. 8. Additionally, the second rear voting section 280 corrects the bubble errors in the third thermometer codes Cn+3, Cn+1, Cn−1, and Cn−3 to generate the third correction codes Tn+3, Tn+1, Tn−1, and Tn−3 as illustrated in FIG. 8. As a result, each of the final output code is a logic high '1' in FIG. 8.

Figure 9:
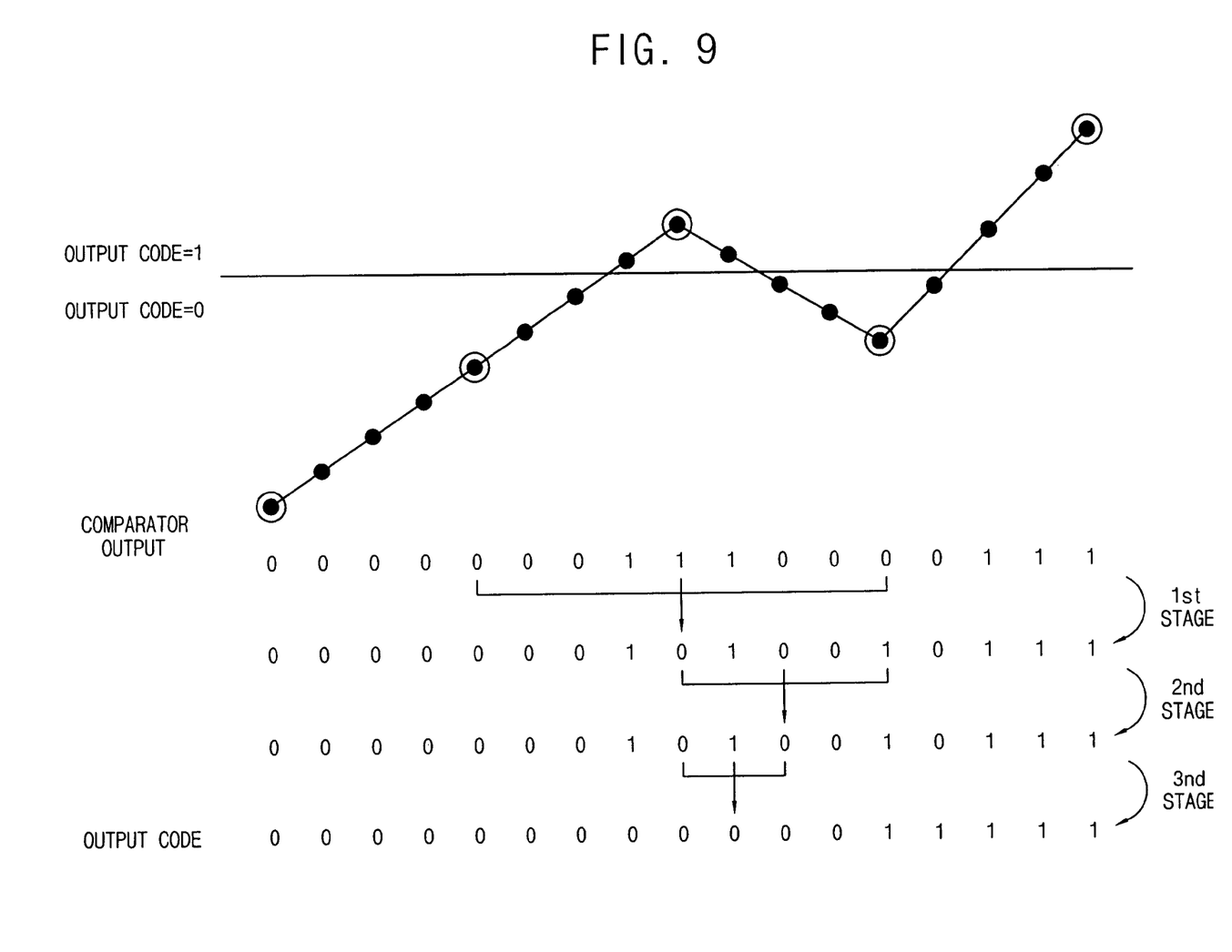
FIG. 9 is a state diagram illustrating another example process for removing bubble errors by the bubble error rejecter in FIG. 7, according to an embodiment of the present invention.

FIG. 9 is a state diagram illustrating another example process of removing the bubble errors by the bubble error rejecter of FIG. 7. Referring to FIG. 9, the thermometer codes output by the comparators have a sequence of '0's, then turn to '1's, then to '0's, and finally to a sequence of '1's. Such a pattern illustrates the typical bubble errors at the boundary.

Referring to FIGS. 7 and 9, the front voting section 260 corrects any bubble error in the first thermometer codes (shown as encircled dots in FIG. 9), as illustrated by the $1^{st}$ stage correction in FIG. 9. In addition, the first rear voting section 270 corrects any bubble error in the second thermometer codes, as illustrated by the $2^{nd}$ stage correction in FIG. 9. Furthermore, the second rear voting section 280 corrects any bubble error in the third thermometer codes, as illustrated by the $3^{rd}$ state correction in FIG. 9.

The final output code has one boundary between the sequential '0's and the sequential '1's. In this manner, by having a cascade of voting sections 260, 270, and 280, the bubble error(s) spanning multiple bits from interpolation in the interpolating section 230 is effectively removed.

While the present invention has been particularly shown and described with reference to exemplary embodiments thereof, it will be understood by those of ordinary skill in the art that various changes in form and details may be made therein without departing from the spirit and scope of the present invention as defined by the following claims. For example, any number of elements, or type of devices, or state diagrams illustrated and described herein are by way of example only.

In addition, the present invention has been described for the bubble error rejecter used within an analog-to-digital converter. However, the bubble error rejecter of embodiments of the present invention may also be applied within other types of data converters or within any type of electronic device or system.

The present invention is limited only as defined in the following claims and equivalents thereof.

What is claimed is:

1. A bubble error rejecter comprising:
    a front voting section for generating first correction codes from first thermometer codes determined from preamplified signals; and
    a rear voting section for generating second correction codes from the first correction codes and second thermometer codes determined from interpolation of the preamplified signals.

2. The bubble error rejecter of claim 1, further comprising:
    another rear voting section for generating third correction codes from the first correction codes, the second correction codes, and third thermometer codes determined from further interpolation of the preamplified signals.

3. The bubble error rejecter of claim 2, wherein the other rear voting section includes a plurality of voters, each voter generating a respective third correction code by determining a majority bit value from a respective third thermometer code, and from one of the first correction codes and one of the second correction codes adjacent to the respective third thermometer code.

4. The bubble error rejecter of claim 1, wherein the front voting section includes a plurality of voters, each voter generating a respective first correction code by determining a majority bit value from a respective set of m consecutive first thermometer codes.

5. The bubble error rejecter of claim 1, wherein the rear voting section includes a plurality of voters, each voter generating a respective second correction code by determining a majority bit value from a respective second thermometer code and two of the first correction codes adjacent to the respective second thermometer code.

6. The bubble error rejecter of claim 1, further comprising:
a plurality of rear voting sections coupled in cascade, each rear voting section generating respective correction codes from the first correction codes, from respective correction codes generated by any prior rear voting section in the cascade, and from respective thermometer codes determined from respective interpolation of the preamplified signals.

7. The bubble error rejecter of claim 6, wherein a total number of rear voting sections is equal to k, with $2^k-1$ being a number of interpolations between two adjacent preamplified signals.

8. The bubble error rejecter of claim 1, wherein the first and second correction codes are coupled to an encoder that generates a digital code corresponding to an input voltage within an analog-to-digital converter.

9. An analog-to-digital converter comprising:
preamplifiers for generating preamplified signals from an input voltage and a reference voltage;
an interpolating section for generating interpolated signals from the preamplified signals;
a comparing section for generating first thermometer codes from the preamplified signals and for generating second thermometer codes from the interpolated signals; and
a bubble error rejecter including:
a front voting section for generating first correction codes from the first thermometer codes; and
a rear voting section for generating second correction codes from the first correction codes and the second thermometer codes.

10. The analog-to-digital converter of claim 9, wherein the bubble error rejecter further includes:
another rear voting section for generating third correction codes from the first correction codes, the second correction codes, and third thermometer codes determined from further interpolation of the preamplified signals.

11. The analog-to-digital converter of claim 10, wherein the other rear voting section includes a plurality of voters, each voter generating a respective third correction code by determining a majority bit value from a respective third thermometer code, and from one of the first correction codes and one of the second correction codes adjacent to the respective third thermometer code.

12. The analog-to-digital converter of claim 9, wherein the front voting section includes a plurality of voters, each voter generating a respective first correction code by determining a majority bit value from a respective set of m first thermometer codes.

13. The analog-to-digital converter of claim 9, wherein the rear voting section includes a plurality of voters, each voter generating a respective second correction code by determining a majority bit value from a respective second thermometer code and two of the first correction codes adjacent to the respective second thermometer code.

14. The analog-to-digital converter of claim 9, wherein the bubble error rejecter further includes:
a plurality of rear voting sections coupled in cascade, each rear voting section generating respective correction codes from the first correction codes, from respective correction codes generated by any prior rear voting section in the cascade, and from respective thermometer codes determined from respective interpolation of the preamplified signals.

15. The analog-to-digital converter of claim 14, wherein a total number of rear voting sections is equal to k, with $2^k-1$ being a number of interpolations between two adjacent preamplified signals.

16. The analog-to-digital converter of claim 9, further comprising:
an encoder for generating a digital code corresponding to the input voltage from the first and second correction codes.

17. A method for correcting bubble error comprising:
generating first correction codes from majority bit voting of first thermometer codes determined from preamplified signals; and
generating second correction codes from majority bit voting of the first correction codes and second thermometer codes determined from interpolation of the preamplified signals.

18. The method of claim 17, further comprising:
generating third correction codes from majority bit voting of the first correction codes, the second correction codes, and third thermometer codes determined from further interpolation of the preamplified signals.

19. The method of claim 18, further comprising:
generating each third correction code from majority bit voting among a respective third thermometer code, and one of the first correction codes and one of the second correction codes adjacent to the respective third thermometer code.

20. The method of claim 17, further comprising:
generating each first correction code from majority bit voting among a respective set of m consecutive first thermometer codes.

21. The method of claim 17, further comprising:
generating each second correction code from majority bit voting among a respective second thermometer code and two of the first correction codes adjacent to the respective second thermometer code.

22. The method of claim 17, further comprising:
generating a plurality of sets of correction codes in cascade from the first correction codes, any prior correction codes in the cascade, and respective thermometer codes determined from respective interpolation of the preamplified signals.

23. The method of claim 22, wherein a total number of the sets of correction codes is equal to k, with $2^k-1$ being a number of interpolations between two adjacent preamplified signals.

24. The method of claim 17, further comprising:
encoding a digital code corresponding to an input voltage from the first and second correction codes within an analog-to-digital converter.

* * * * *